United States Patent [19]

Veale

[11] 4,064,364
[45] Dec. 20, 1977

[54] AUDIO FIDELITY AMPLIFIER AND PREAMPLIFIER SYSTEMS

[75] Inventor: John R. Veale, Los Angeles, Calif.

[73] Assignee: Sultan Products, Incorporated, Inglewood, Calif.

[21] Appl. No.: 645,839

[22] Filed: Dec. 31, 1975

[51] Int. Cl.² .................................... H04R 3/12
[52] U.S. Cl. .................... 179/1 B; 179/1 SW
[58] Field of Search ............. 179/1 B, 1 G, 1 AT, 179/1 SW, 1 D, 1 MN, 1 J

[56] References Cited

U.S. PATENT DOCUMENTS

| | | | |
|---|---|---|---|
| 2,110,358 | 3/1938 | Dreisbach | 179/1 B |
| 3,541,260 | 11/1970 | Jarvis | 179/1 J |
| 3,878,472 | 4/1975 | Osakabe | 179/1 G |
| 3,914,549 | 10/1975 | Bose | 179/1 G |
| 3,921,104 | 11/1975 | Gundry | 179/1 D |
| 3,941,931 | 3/1976 | Osakabe | 179/1 G |

FOREIGN PATENT DOCUMENTS 1,260,539  2/1968  Germany ..................... 179/1 VL

OTHER PUBLICATIONS

Electronic Analog Computers by G. Korn, McGraw-Hill, 1956, pp. 12 & 13.

Primary Examiner—Douglas W. Olms
Attorney, Agent, or Firm—Robert J. Schaap

[57] ABSTRACT

An audio fidelity system which may adopt the form of a preamplifier or a preamplifier-amplifier combination and which includes facilities for mixing any of a plurality of input sources. In addition, the system permits equalization of the frequencies in each of a plurality of audio fidelity channels in the provision of a separate potentiometers for each of the major frequency of each channel. The circuit is uniquely designed to eliminate hum which normally occurs in low-level switches by eliminating the feedback through the amplifier circuits.

21 Claims, 4 Drawing Figures

AUDIO FIDELITY AMPLIFIER AND PREAMPLIFIER SYSTEMS

BACKGROUND OF THE INVENTION

This invention relates in general to certain new and useful improvements in audio fidelity amplifier systems and, more particularly, to audio fidelity amplifier systems which include provision for mixing of a number of input sources and selective equalization of the frequencies in such input sources and output circuits thereof.

In recent years, there have been many advancements in the field of audio fidelity recording and reproducing, both in professional areas and in the so-called "home audio fidelity systems". In the professional area, where audio-fidelity equipment is used, as for example in recording studios, these advances lie in improved recording amplifiers and in mixing facilities, as well as in various forms of frequency equalization facilities. However, these various professional systems are quite expensive and are generally designed only for professional use.

There have also been many advances in the audio fidelity recording and reproducing systems, as for example the so-called "stereophonic amplification systems for home use," that is for use by individuals other than the professionals. Nevertheless, the developments for the so-called "home" stereophonic fidelity market have been relatively limited in terms of versatility of the systems which are available. For example, there are relatively few amplifiers and preamplifiers which even remotely approach the capabilities of the so-called professional amplification systems. There has been a relatively recent introduction into the marketplace of a preamplifier capable of providing frequency equalization. However, these systems lack substantially in quality and even though they provide equalization facilities, they are severely limited in their versatility.

Heretofore, there has been no amplification system, such as a preamplifier or an integrated amplifier-preamplifier, which provides mixing capabilities for mixing a plurality of input sources and equalization of either the input and/or output sources from the amplification system. Even moreso, the commercially available systems which even do provide for preamplification and equalization are severely limited in that they do not provide facilities for selection among various sources, dubbing from various channels, and the like.

It is, therefore, the primary object of the present invention to provide an audio fidelity amplification system which is capable of providing both amplification, mixing of selected individual input sources, and independent equalization of the frequencies in each of the channels.

It is another object of the present invention to provide an amplification system of the type stated which is constructed with a high degree of quality and is capable of rendering the desired outputs on a relatively low distortion free level.

It is a further object of the present invention to provide an amplification system of the type stated which is highly reliable in its construction and which can be constructed at a relatively low cost.

It is an additional object of the present invention to provide a preamplifier as well as an integrated amplifier-preamplifier combination which is capable of substantially reducing the effect of hum and other electrical noise resulting from low level switches in the amplification system.

It is also an object of the present invention to provide an amplification system of the type stated which is capable of handling various inputs of a wide dynamic range and rendering outputs with a very low distortion factor and which are relatively noise-free.

With the above and other objects in view, my invention resides in the novel features of form, construction, arrangement and combination of parts presently described and pointed out in the claims.

SUMMARY OF THE INVENTION

This invention relates in general to audio fidelity amplification systems, such as preamplifiers and integrated amplifier-preamplifier combinations. In the preferred aspect of the invention, the preamplifier includes the facilities for mixing any of a number of selected input sources and, in addition, includes equalization facilities for equalizing the frequencies in any of the output channels.

The preamplifier of the present invention, in a preferred aspect, includes a selection system for selection of a first phonograph input, a first tuner input and a first tape input. In addition, the preamplifier includes a second selection input, as for example, a second phonograph input, a second tape input and an auxiliary input. Individual volume controls are associated with each of these first and second selection sources. Moreover, an individual microphone volume input source is provided.

The preamplifier of this invention also includes a potentiometer operated bass control, a potentiometer operated treble control and a potentiometer operated balance control. Moreover, the preamplifier of the present invention provides a mixing capability in that the user thereof can select any of the input sources from the first selection and any of the input sources from the second selection and mix these input sources in a manner as hereinafter described.

The preamplifier of the present invention also includes dubbing controls such as a first source to a second source or a second source to a first source. Thus, for example, a phono-1 input source could be combined with a tape-2 input source or, otherwise, a tuner input source could be combined with a phono-2 source, etc. For this purpose, the preamplifier system of the present invention is provided with a first-second dubbing control and a second-first dubbing control. In addition, the preamplifier system includes dubbing monitors for each of the two input sources such that the various input sources could be monitored during recording thereof. Moreover, the preamplifier includes a tape dubbing equalization, as well as a line equalization.

As indicated previously, the preamplifier of the present invention includes an equalization facility in the form of a first set of potentiometers capable of equalizing frequencies included in one of the channels and a second set of potentiometers capable of equalizing the frequencies of the second of the channels in a stereophonic input-output system. An individual volume control is provided for the output of the preamplifier. Moreover, the preamplifier of the present invention includes selection between a first and second system, such that two systems can be operated individually or simultaneously from the preamplifier.

BRIEF DESCRIPTION OF THE DRAWINGS

Figure 1A:
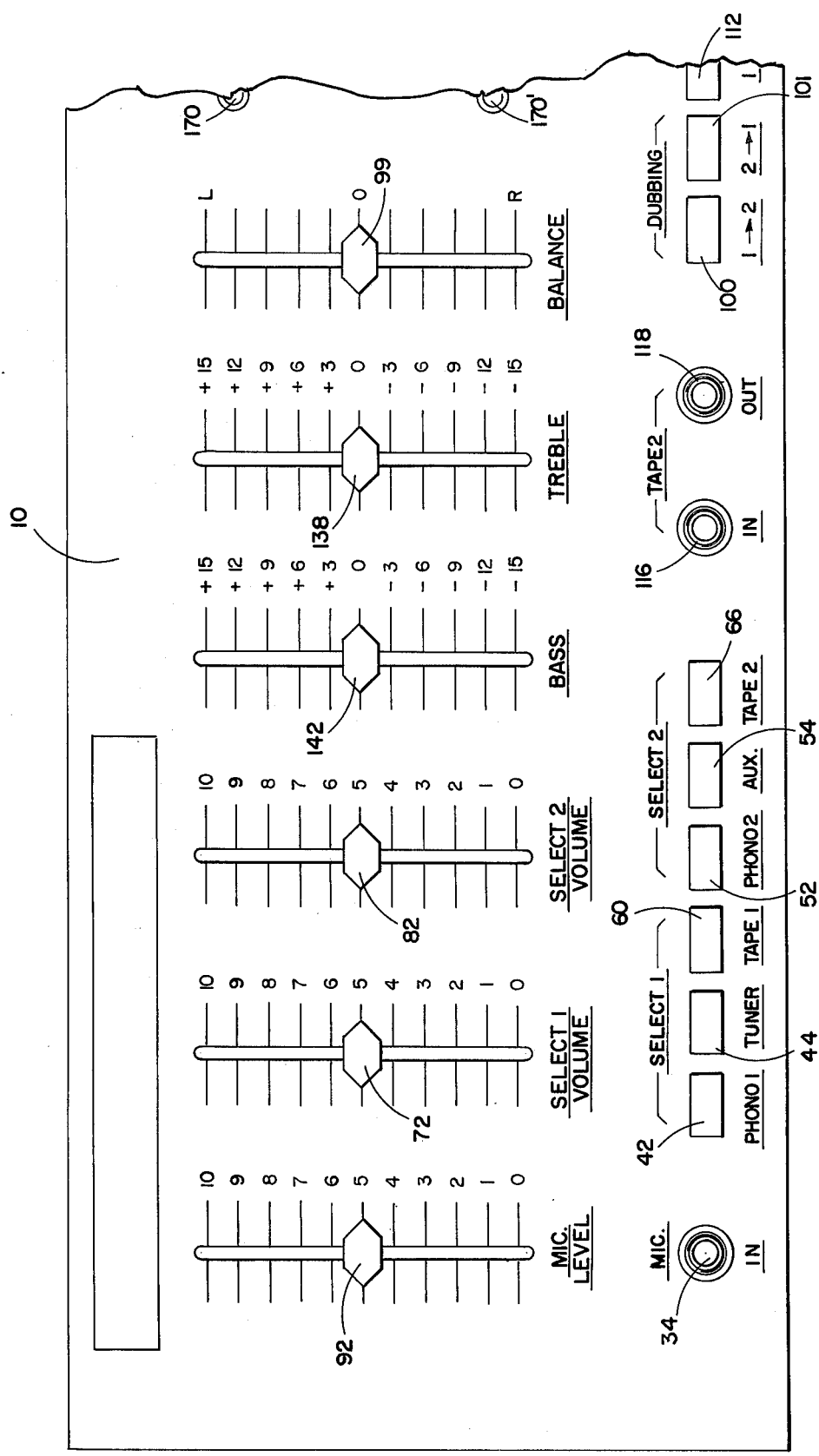
Figure 1B:
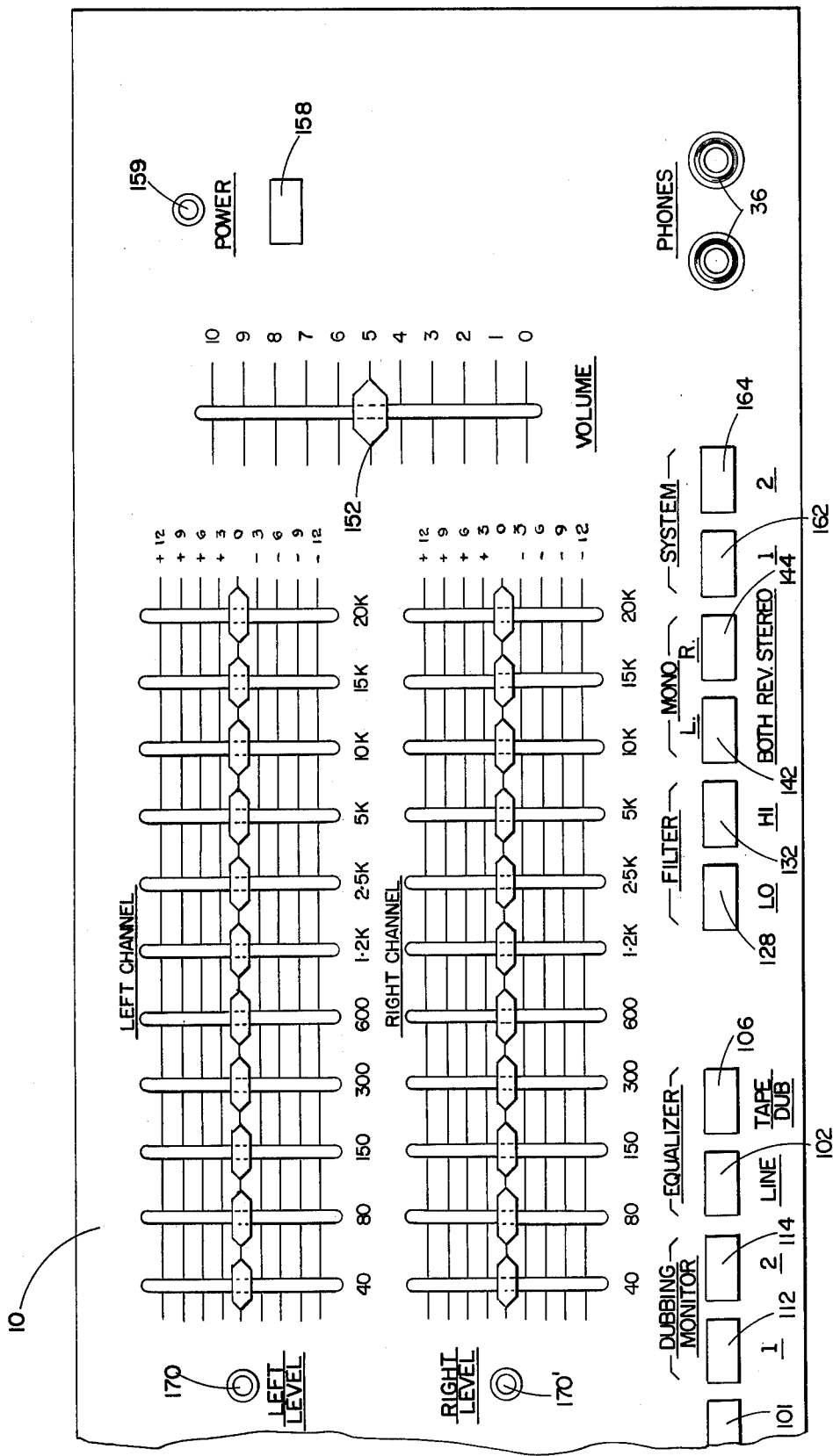
Figure 2:
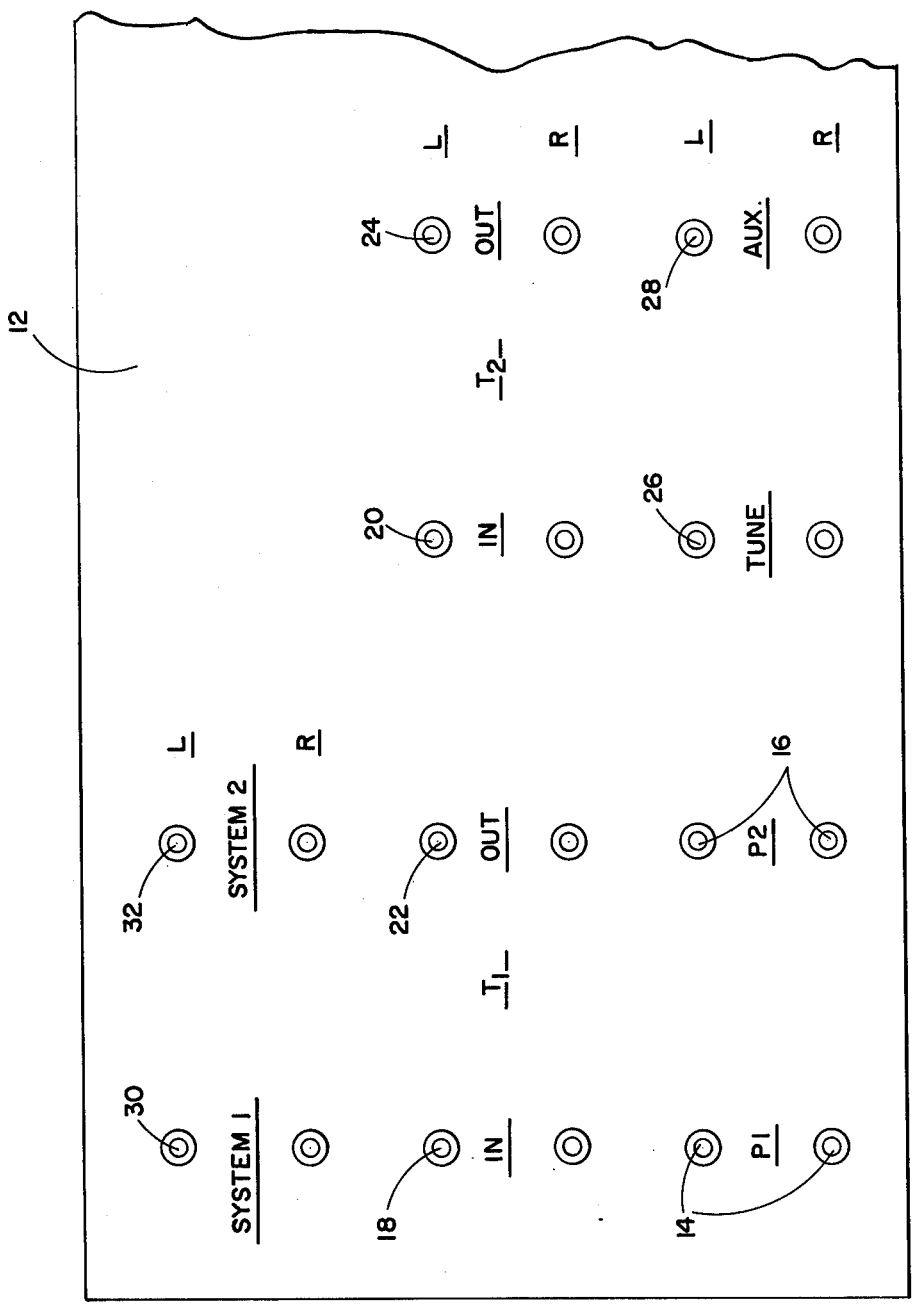
Figure 3:
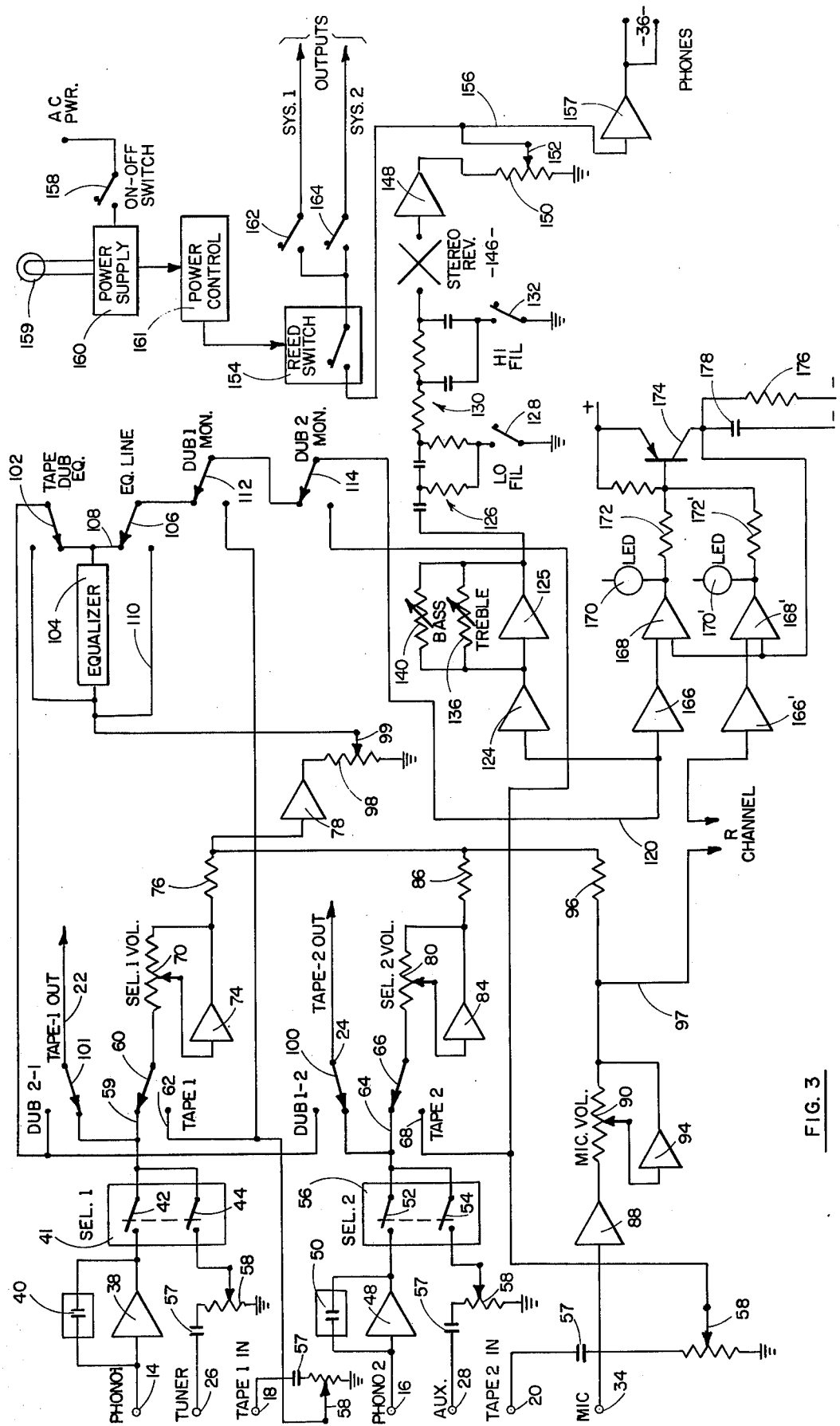

Having thus described the invention in general terms, reference will now be made to the accompanying drawings in which:

FIG. 1, including FIGS. 1A and 1B, is a front plan view of an audio fidelity amplification system constructed in accordance with and embodying the present invention;

FIG. 2 is a rear elevational view of a back panel forming part of the audio fidelity amplification system of FIG. 1; and FIG. 3 is a schematic electrical view showing a part of the circuitry forming a portion of the amplification system of FIGS. 1 and 2.

DETAILED DESCRIPTION

Referring now in more detail and by reference characters to the drawings, A designates a preamplifier which would normally be included within a conventional housing, such as a rectangularly shaped housing. Normally, conventional construction of preamplifiers includes a metal chassis with a metallic rectangularly shaped housing mounted on the chassis and which may be provided with aesthetic wooden casing or wooden end walls. Nevertheless, the front panel 10 of this amplification system is more fully illustrated in FIG. 1 of the drawings and the circuitry forming the major part of the amplification system is illustrated in FIG. 3.

A back panel 12 forming part of this amplification system is more fully illustrated in FIG. 2 of the drawings, and in this case it can be observed that the back panel 12 includes a plurality of input and output receptacles. In this case, it can be observed that the receptacles are provided in pairs in order to receive jacks of a conventional type, that is, plugs which are received in the receptacles. While each of the input and output sources are shown with two receptacles for receiving jacks, as illustrated in FIG. 2, for purposes of simplicity the circuitry drawing of FIG. 3 only illustrates one such jack for each input and output circuit. It should be recognized that the circuit in FIG. 3 represents only one audio channel such as the left channel, and the circuit for the other channel, such as the right channel, would be substantially identical. Hence, the one receptacle for each input and output circuit in FIG. 3 represents the left channel, the second receptacle, shown in FIG. 3, serves as an input or output, as the case may be, for the right channel.

The back panel 12 is provided with a pair of phonographic inputs which are designated as "PH$_1$" and "PH$_2$" and are referenced by reference numerals 14 and 16, respectively. Thus, by referring to FIG. 2, it can be observed that for each of the channels a pair of phono-1 inputs 14 are provided and a pair of phono-2 inputs 16 are provided. Again, and by reference to FIG. 3 of the drawings, it can be observed that only one phono-1 input 14 is shown and one phono-2 input 16 is shown, the other phono input, illustrated in FIG. 2, serving as the second channel input, e.g. the right channel input.

The back panel 12 is provided with a pair of tape-1 input receptacles designated as 18, and a pair of tape-2 input receptacles designated as 20. Moreover, the back panel is provided with a pair of tape-1 outputs designated as 22 and a pair of tape-2 outputs designated as 24. In this case, the term "phono" inputs represent inputs from a conventional phonograph such as a recording-playing turntable. The term "tape" inputs or outputs represents conventional tape recording and receiving decks or cassette players or the like.

As indicated above, each of the input sources and the output sources, such as the phonograph input sources and or the tape input sources and the tape output sources represents a left channel and the other of the receptacles represent a right channel source, as for example, a stereophonic recording. Obviously, if monophonic recording or reproduction were employed, only a single channel would be provided. In this same respect, it can be observed that the present invention is applicable to four-channel or multiple channel recordings and, consequently, a separate jack-receiving receptacle would be employed for each channel.

The back panel 12 also includes a pair of tuner input jack-receiving receptacles designated as 26 and a pair of auxiliary jack-receiving receptacles 28. Moreover, the back panel also includes output jack-receiving receptacles designated as "SYS-1" with reference numeral 20 and "SYS-2" with reference numeral 32, representing system-1 and system-2. In this case, the system-1 and system-2 outputs are capable of being used for separate output systems, as for example, conventional audio fidelity speakers, or the like.

The back panel 12 may also be provided with various switched and unswitched line inputs, as well as conventional fuses, antenna terminals (not shown), and the like which are normally found on various forms of amplifiers. Inasmuch as these various input and output elements are conventional, they are neither illustrated nor described in any further detail herein.

The front panel 10 includes a microphone input jack-receiving receptacle 34, which, in this case, is a monophonic input. Moreover, the front panel 10 also includes a pair of earphone output receptacles designated as 36 which are designed to receive headphone jacks of the conventional construction.

The phono-1 input is connected into the input of an amplifier 38 which has an equalization feedback circuit 40 connected thereacross. The equalization circuit 40 is primarily a capacitive feedback circuit and therefore has been illustrated as a capacitive feedback circuit. Moreover, this equalization circuit is an RIAA, or "Record Industry Association of American," equalization circuit designed to accommodate record inputs to the other inputs to the system. The output of the amplifier 38 is introduced into a phono select-1 push-button switch 42 and the tuner input 26 is connected to select-1 push-button switch 44, both of which are mounted on the front panel 10. In this case, it can be observed that the select-1 switch 42 and the select-1 switch 44 are in "ganged" construction, and therefore are included within a box 46 illustrated in dotted lines. In accordance with the ganged construction, if the phono-1 switch 42 is closed, the tuner switch 44 will open. In like manner, if the tuner switch 44 is closed, the phono-1 switch 42 will automatically open.

The phono-2 input receptacle is connected through an amplifier 48 having a capacitive feedback circuit 50 similar to the circuit 40 connected thereacross. The output of the amplifier 50 is connected into a phono-2 select push-button switch 52 which is mounted on the front panel 10. In addition, the auxiliary input receptacle 28 is connected directly to a push-button switch 54 which is similarly mounted on the front panel 10 and is mechanically ganged with respect to the switch 52 by means of a mechanical gang and which is schematically illustrated in dotted lines designated as 56.

Inasmuch as the phono-1 input 14 and the tuner input 26 are ganged, only one of such inputs can be selected at any point in time. The same holds true with respect to the phono-2 input 16 and the auxiliary input 28. By further reference to FIG. 3, it can be observed that the tape-1 input 18 and the tape-2 input 20 are not ganged and, therefore, dependent upon any other input. The tape-1 and tape-2 inputs 18 and 20 each are provided with capacitors 57 and internally adjustable potentiometer 58 which are designed to set the gains of the aplifier portion of the circuit to adjust to the two phono inputs. These potentiometers are located within an enclosed housing and are designed for factory or manufacturing adjustment.

The two switches 42 and 44 have a common output which serves as one terminal 59 of a tape-1 select push-button switch 60 which is mounted on the control panel 10. The tape-1 input 18 serves as the other terminal 62 of the tape-1 input select push-button switch 60. In like manner, the outputs of the switches 52 and 54 are commonly connected and serve as one terminal 64 of a tape-2 select push-button switch 66, which is also mounted on the front panel 10. The tape-2 input 32 serves as another terminal 68 of the tape-2 select switch.

The other terminal of the tape-1 select switch 60 is connected through a select-1 volume potentiometer 70 having a movable element 72 mounted on the front panel. The movable element of the potentiometer 70 is also connected through an amplifier 74 and a limiting resistor 76 to an operational amplifier 78. Moreover, the other terminal of the tape-2 select switch 66 is connected through a select-2 volume potentiometer 80 having a movable element 82 mounted on the front panel 10. The movable element 82 is connected through an amplifier 84 and a limiting resistor 86 to the operational amplifier 78.

It can be observed that the volume controls 70 and 80 are actually volume controls with gain. By using the potentiometers in these controls as variable feedback elements, it is possible to vary between total loss and gain, as compared to the prior art volume control which is merely a variable attenuation device.

The microphone input receptacle 34 is similarly connected through an amplifier 88 and to a microphone volume control potentiometer 90 having a movable element 92 which is similarly on the front panel 10. The movable element 92 is connected through an amplifier 94 and to a limiting resistor 96 to the operational amplifier 78, in the manner as illustrated in FIG. 3 of the drawings.

In this respect, it is important that the microphone input 34 includes an amplifier, such as the amplifier 88, prior to any volume control therefor, such as the microphone volume potentiometer 90. It should be observed that the input signal from a microphone is nominally approximately 1 millivolt, although many microphones have a wide dynamic range on the input which may extend up to about 1 volt. By utilizing an amplifier 88 prior to the volume control 90, it is possible to remove most of the noise level so that the input noise level at the volume control 90 is exceedingly low.

Moreover, and in this same respect, it was indicated previously that FIG. 3 only discloses one channel of an amplification system, such as the left channel. The right channel of this amplification system would essentially be a duplicate of the left-hand channel illustrated in FIG. 3 and hence, the right-hand channel is neither illustrated nor described in any further detail herein.

Nevertheless, it can be observed that the output of the microphone volume control potentiometer 90 and the amplifier 94 is provided with an output 97 which is connected to the other channel, such as the right channel.

The output of the operational amplifier 78 is connected to a balanced potentiometer control 98 which has a movable element 99 mounted on the front panel 10. In this way, it is possible to balance between the various channels, such as the left and right output channels. Moreover, it can be observed that one terminal of the coils of the balanced potentiometer 98 is connected to the other channel, such that balance may be obtained between the outputs of these two channels.

By further reference to FIG. 1 of the drawings, it can be observed that the front panel 10 is also provided with a bank of dubbing control switches and which include a dubbing 1-2 push-button switch 100 and a dubbing 2-1 push-button switch 101, which are mounted on the front panel 10. It can be observed that the dubbing 1-2 switch 100 includes one terminal which is a combined output of the two switches 52 and 54, and the dubbing 2-1 switch 101 includes one terminal which is a combined output of the switches 42 and 44, in the manner as illustrated in FIG. 3 of the drawings. It also can be observed that each of the dubbing switches 100 and 101 include a dubbing terminal which are connected in common and are also connected to one terminal of a tape dubbing equalizer push-button switch 102, the latter of which is also mounted on the front panel 10.

Moreover, it can be observed that one of the terminals of the dubbing 1-2 switch 100 is connected to the tape-2 output 24 and one terminal of the dubbing 2-1 switch 101 is connected to the tape-1 output 22. It can be observed that when the dubbing 1-2 switch 100 is depressed, it will connect the mixer stage output to the tape-2 output for purposes of dubbing a select-1 input and a select-2 input, or either of them, onto the tape of a tape-2 or, otherwise, auxiliary tape deck. In like manner, when the dubbing 2-1 switch 101 is depressed, this switch will permit the connection of the mixer stage output to the tape-1 output for the purposes of recording the output of the mixer stage or a select-1 output onto the tape of the tape-1 deck.

By further reference to FIG. 3, it can be observed that the tape dubbing equalizer switch 102 has its opposite terminal connected to an equalizer circuit 104, the latter of which is more fully illustrated and described in copending U.S. patent application Ser. No. 645,805, filed on even date herewith. This equalization circuit 104 is designed to equalize the various primary eleven frequencies in each channel, and, in this case, the left-hand channel as illustrated in FIG. 3 of the drawings.

While any of a number of known equalization circuits could be employed, the equalization circuit which has been adopted for use in the present invention is that described in the aforesaid copending patent application and which is the preferred form of circuit. It can also be observed that the output of the operational amplifier 78 through the arm 94 of the balance control potentiometer 98 is introduced into the equalization circuit 104. In this way, the various phono inputs and the various tape inputs, as well as the tuner and the auxiliary inputs, can all be equalized through the equalization circuit 104.

The equalization circuit can be bypassed by means of an equalization line switch 106 which receives an output 108 from the equalization circuit and from the tape dubbing equalizer switch 102, or an output 110 directly from the operational amplifier 78 through the balance control potentiometer 79. In this way, the various inputs can be equalized if desired, or otherwise equalization can be bypassed by means of the equalization line switch 106. In this same respect, the tape dubbing output can also be equalized, or otherwise bypassed through the tape dubbing equalizer switch 102. The operation of the two switches 102 and 106 in combination will be more fully described hereinafter.

Also mounted on the front panel 10 and included within the bank of dubbing switches is a dubbing monitor-1 switch, designated by reference numeral 112, and a dubbing monitor-2 switch, designated by reference numeral 114. Each of these switches 112 and 114 are conventional off/on manually operated push-button switches. By further reference to FIG. 3, it can be observed that the dubbing monitor-1 switch 112 may be connected between either the tape-1 output 22, or otherwise the tape-1 input 18. The tape monitor-2 switch 114 may also be connected between the tape-2 output 24 or otherwise the tape-2 input 20. Moreover, each of these switches 112 and 114 may be connected to the output from the equalization line switch 106. In this way, it is possible to select any of a number of input circuits to the dubbing monitor switches 112 and 114. Thus, the monitor switches may dub any of the input sources which may or may not pass through the equalizing circuit 104 in accordance with the position of the equalizing line switch 106. The tape dubbing monitor switches 112 and 114 may select between the tape input and tape output circuits. In this way, it is possible to evaluate the input circuit to a tape recording or otherwise the output of the tape recording in order to determine the effectiveness of a recording on a remote tape. This circuitry will be described in more detail hereinafter It can be observed that with the unique combination of dubbing and equalization switching, the user of the device will have the ability to select any two out of six inputs and mix the inputs together. Moreover, it is also possible to mix a microphone input with these two selected inputs.

For purposes of convenience, the front panel 10 may also be provided with tape-2 input and output receptacles 116 and 118, respectively, and which are also respectively connected to the tape input receptacle 20 and the tape output receptacle 24. These latter receptacles are only provided as a matter of convenience and are not necessarily critical to the present invention.

The output of the dubbing monitor switch 114 is connected through an amplifier 124 to another amplifier 125. A low filter 126, being operable by a low filter switch 128, receives the output of the amplifier 125 directly. The actual design of the low filter 126 is not critical to the present invention, and any of a number of low filters could be employed. In this case, it can be observed that the low filter 126 includes a pair of series connected capacitors with a pair of resistors connected across each of these capacitors, in the manner as illustrated. The output of the low filter 126, which is also mounted on the front panel 10, is connected to the input of a high filter 130 operable by a high filter switch 132, which is also mounted on the front panel 10.

In this case, it can be observed that the high filter 130 is comprised of a pair of resistors connected in series with each of the uncommon sides of the resistors being grounded through capacitors in the manner as illustrated in FIG. 3. It can be observed that the high filter 130 can also be bypassed by means of the high filter switch 132. In this way, it is possible to introduce both the high filter 130 and/or the low filter 126 by proper actuation of the high filter switch 132 and the low filter switch 126, respectively.

Also connected across the amplifier 125 in feedback relationship thereto is a treble potentiometer 136 which has a movable element 138 mounted on the front panel 10. Furthermore, and connected across the amplifier 125 in feedback relationship thereto, is a bass potentiometer 140 which similarly has a movable element 142 mounted on the front panel 10. The bass and treble controls operate in essentially a conventional manner by adjusting the gain across the amplifier 125 in order to achieve a bass or treble output as may be desired.

Similarly mounted on the front panel 10 is a monophonic left channel switch 142 and a monophonic right channel switch 1422 which are both designated by the double-pull, double-throw switch 146, as illustrated in FIG. 3 of the drawings. In this case, it can also be observed that four contacts would be employed for the switch 146 and one of these contacts is provided by the left monophonic switch 142 and the other of which is provided by the right monophonic switch 144. In like manner, the opposite channel would have left and right inputs corresponding to those inputs controlled by the monophonic switches 142 and 144, respectively.

The output of the switch 146 is connected through a main volume amplifier 148 and through a main volume control potentiometer 150, the latter of which is provided with a movable element 152 mounted on the front panel 10. In this case, it can also be observed that the output of the main output amplifier 148 through the main volume control potentiometer 150 is connected through a reed switch 154 with an output alternately connectable to the system-1 switch 30 and the system-2 switch 32. In like manner, it can be observed that the main volume amplifier 148 has an output 156 connected through an amplifier 157 and the output of this amplifier 157 may be connected to the headphone output receptacles 36 mounted on the front panel 10.

The front panel is also provided with a power control switch 158 which is shown in the circuit of FIG. 3 of the drawings. This power control switch 158, which is essentially an off/on switch, is connected in the main power input to the circuit in conventional construction. Moreover, a power indicator light 159 which may be a conventional neon bulb, or otherwise a light emitting diode, and which is also mounted on the front panel 10 is connected in series with one of the main power lines to the switch 158 in order to indicate when power is supplied to the circuit of FIG. 3.

The actual connection of the main power switch 158 and the indicator light 159 is essentially conventional in its construction so that they are not described or illustrated in any further detail herein. Nevertheless, it is pointed out that the power switch 158 and the indicator light 159 may be connected through a conventional transformer and a power supply 160 which is essentially conventional in its construction. The power supply is connected through a power-up circuit 161 to the reed switch 154 and which is designed to permit the other components of the circuit to warm up.

By further reference to FIG. 3 of the drawings, it can be observed that the output of the output amplifier 148 and the reed switch 154 can be connected to either the system-1 output receptacle 30 or the system-2 output receptacle 32 through respective system-1 and system-2 selection switches which are designated by reference numerals 162 and 164 in the drawings, and which are also mounted on the front panel 10.

By further reference to FIG. 3, it can also be observed that the output of the dubbing switch 114 is connected through an amplifier 166 and a second amplifier 168 to a light emitting diode or similar light indicating device 170, which is mounted on the front panel 10. In like manner, the opposite channel of the circuit has an output from its dub-1 and dub-2 potentiometer controls to an amplifier 166′ and a second amplifier 168′ to a second light indicator, such as a light emitting diode 170′. Again, the light indicator 170′ is similarly mounted on the control panel 10, and which provides levels of the equalization of the frequencies controlled through the equalization circuits 104. In this case, it can be observed that the amplifiers 168 and 168′ have a corresponding common input. Moreover, the opposite terminals of the light emitting diodes or similar light indicating devices 170 and 170′ are grounded.

In any event, the light emitting diodes 170 and 170′ have the positive terminals connected through resistors 172 and 172′ to a resistor 174 which has its collector thereof connected through an R-C circuit including a resistor 176 and a capacitor 178 both of which are grounded in the manner as illustrated in FIG. 3. The actual operation of these level control lights 170 and 170′ will be more fully described hereinafter.

With respect to the present invention, it can be observed that the balance of the various channels, as for example in a stereo system, occurs before equalization of the various bands in each of these channels through the equalization circuit 104. In this way, the balance control lights 170 and 170′ will become energized after equalization and will advise the user of the system whether or not the actual output is balanced. In essence, the balance control provides for adjustment of the balance between two channels in the circuit. Consequently, in this way, it is possible to correct between the balance early in the system so that the lights 170 and 170′ actually serve as a form of feedback system.

With respect to the prior art, it can be observed that the various inputs, such as the phono-1 and the phono-2 input, the tuner input and the auxiliary input, and even the tape inputs, were connected directly through a multi-position selector switch and then through an amplification system into the tape monitor and tape recording outputs. Consequently, the tape input and tape output were connected essentially across the various inputs such as phonograph inputs, the tuner inputs, and the auxiliary inputs. In the case of the present invention, it can be observed that all noise has been removed from these inputs prior to any type of recording or dubbing operation.

With respect to the select volume-1 control 80 and the select volume-2 control 80, it can be observed that only a selection of either the phonograph-1 input or the tuner input may be provided, and in like manner, only a selection of the phonograph-2 input or the auxiliary input can be provided and controlled by the volume-1 and volume-2 controls. Moreover, these volume-1 and volume-2 controls operate independently of each other. In addition, it can be observed that by use of proper selection it is possible to select from any of the select-1 possibilities and the select-2 possibilities in order to mix the inputs. For example, it can be observed that by actuating the switch 42, it is possible to introduce a phono-1 input and by actuating the tape-1 input switch 66, it is possible to introduce a tape-2 input. Consequently, these two inputs could be mixed. Alternatively, the tuner input actuated by the switch 44 and the auxiliary input actuated by the switch 54, or, otherwise, for example, the tuner input actuated by the switch 44 and the phono-2 input actuated by the switch 52 could also be mixed by proper selection of the select-1 switches or the select-2 switches.

It can be observed that the phono-1 and the tuner switches are ganged so that if the user selects the tape-1 switch, it is not ganged to the phonograph-1 or the tuner input and, consequently, both inputs can be received at a tape output. Consequently, it can be observed in thiat respect, that the tape-1 monitor switch is used for normal operations. Moreover, and in this same respect, it can be observed that it is not possible to provide a tape-2 output in order to record on a tape-2 from a phonograph 1 input unless the dubbing controls are used, as for example, by actuating the dubbing-2 switch 114. In this way, it is impossible to record from the output of a mixed combination.

Another important aspect of the present invention is that the bass and treble controls which basically control the output levels incur after the equalization through the equalizing circuit 104; although, it can be observed that equalization through the equalizing circuit 104 can be bypassed through the switch 106. The equalizer is designed to provide more bass and treble if desired. In essence, the equalizer is used in adjusting the system response where bass and treble controls are used in adjusting the output from that instantaneous point in time. Consequently, if one desires to select tape dubbing directly, it is not affected by the equalizer controls, but is clearly affected by the volume control. Nevertheless, when the user of the system selects tape dubbing, the outputs are not received directly from the input receptacles, but recording occurs after mixing and equalization. Nevertheless, recording does occur before bass and treble control and also before any effect by the high and low filters. By using the dubbing monitor switches, such as the switches 112 and 114, it is possible to literally hear (through a speaker system neither illustrated nor described) the input to a tape or similar recording medium after mixing and equalization. Nevertheless, it can be observed that the two dubbing switches 112 and 114 are ganged so that it is possible to receive an input which has been mixed, or otherwise which has been mixed and/or equalized. The type equalization switch 102 only affects a tape dubbing operation. The equalization line switch 106 switches those outputs from the main amplifier 78, such that it is possible to compare the signals before equalization and after equalization. In this way, the tape dubbing will not affect the recording, since the tape dubbing equalization switch 106 provides that level which is directly reproduced from a tape.

By actuating the left and right monophonic switches 142 and 144, it is possible to determine the sound levels which are coming in on the left and right-hand channels. Thus, if one actuated the left monophonic switch, it is possible to hear that information which is occurring on the output to the left channel. In like manner, by actuating the switch 144, it is possible to reproduce the material at the output of the right monophonic channel. By actuating both of the switches 142 and 144, it is possible to literally reverse the channels, as schematically illustrated by the switch 146 in FIG. 3, in the event that the left and right speakers of each of the channels were erronaeously connected.

Thus, there has been illustrated and described a unique and novel audiophonic amplification system which may serve as a preamplifier and/or an integrated preamplifier-amplifier combination, and which therefore fulfills all of the objects and advantages sought therefor. It should be understood that many changes, modifications, variations and other uses and applications will become apparent to those skilled in the art after considering this specification and the accompanying drawings. Therefore, any and all such changes, modifications, variations and other uses and applications which do not depart from the nature and spirit of the invention are deemed to be covered by the present invention which is limited only by the following claims.

Having thus described my invention, what I desire to claim and secure by letters patent is:

1. An audio fidelity amplification system comprising
   a. first and second phonograph input means having a first and second manually operable phonograph switch means,
   b. first and second tape input means having first and second manually operable tape switch means permitting recording or reproducing on either of first or second tapes associated with said first and second tape input means,
   c. first tuner input means having a tuner switch means,
   d. first auxiliary input means having an auxiliary switch means,
   e. first ganging means operatively connecting said first phonographic switch means and tuner switch means so that only one of said first phonographic input means and tuner means is selected to provide a first phonographic signal or tuner signal,
   f. second ganging means operatively connected to said second phonographic means and auxiliary means to select between said second phonographic means and auxiliary means to provide a signal from said auxiliary means or a second phonographic signal,
   g. first manually operable tape dub select means to select between a first output signal of said first ganging means to provide a first output signal for a 1-2 dubbing on said first tape,
   h. second manually operable tape dub select means to select between a second phonographic signal and a signal from the auxiliary means for a 2-1 dubbing on said second tape,
   i. variable equalizer means for equalizing the bands of frequencies in the signals from said first or second ganging means,
   j. a dubbing equalizer switch operatively connected to said first and second tape dub select means to permit said signals to pass through said equalizer means,
   k. a line switch operatively connected to said first and second tape dub select means to permit said signals to bypass said equalizer means,
   l. first dubbing monitor means operatively connected to said dubbing equalizer switch and line switch to permit audio rendition of the signal from said first ganging means, and
   m. second dubbing monitor means operatively connected to said dubbing equalizer switch and line switch to permit audio rendition of the signal from said second ganging means.

2. The audio fidelity amplification system of claim 1 further characterized in that equalizer means is operatively connected to said first and second ganging means and first and second tape dub select means to manually and variably equalize frequencies of the signals introduced thereinto.

3. The audio fidelity amplification system of claim 2 further characterized in that equalizer select means is operatively connected to said equalizer means to select between tape dubbing equalization so that the signal from one tape is equalized prior to being recorded on the other tape and line equalization so that the output signal is equalized prior to being recorded.

4. An audio fidelity preamplification system comprising a plurality of first audio input source receiving elements for receiving first audio type input signals, first manually operable switch means to select between any one or more of the first audio input signals, a plurality of second audio input source receiving elements for receiving second audio type input signals, second manually operable switch means to select between any one or more of the second audio input signals, third manually operable switch means operatively connected to said first and second switch means for mixing any of said first and second input signals, separate select volume control means operatively associated with certain of said input source receiving elements to control the respective volumes of the input signals being mixed, adjustable equalization means connected to receive any of said first or second input signals or mixed first and second input signals to equalize the bandwidths of the frequencies in said input signals, fourth manually operable switch means to connect said input signals to said equalization means to permit equalization of the frequencies in said input signals when actuated, fifth manually operable switch means to select between equalization of said input signals or an output signal derived therefrom and when actuated permits equalization of the frequencies in the output signal, said fourth and fifth switch means being operable in combination to permit said input signals to be directed as an output without equalization thereof, and main volume control means operatively connected to said mixing means and equalization means to control the volume of said output signal.

5. The audio fidelity preamplification system of claim 4 further characterized in that means is operatively connected to said main volume control means to select between first and second output channels from said system.

6. The audio fidelity preamplification system of claim 5 further characterized in that said equalization means includes a plurality of individual distinct potentiometer control elements for controlling certain of the bands in each channel of any input signal or the output signal.

7. The audio fidelity preamplification system of claim 4 further characterized in that said system comprises a plurality of manually operable dubbing monitor switches to selectively monitor either the input signals or the output signals of said system.

8. The audio fidelity amplification system of claim 4 further characterized in that one of each of said first and second source receiving elements comprise a phonographic input element and another one of each of said first and second source receiving elements comprises a recording-reproducing tape input element, and internal potentiometer means is operatively connected to each of said tape input elements to equalize the incoming signal relative to the phonographic input signals.

9. The audio fidelity amplification system of claim 4 further characterized in that said first source receiving elements comprise a first phonographic input element, a tuner input element and a first recording-reproducing tape input element, and that said second source receiving elements comprise a second phonographic input element, a second recording-reproducing tape input element and an auxiliary input element.

10. A method of amplifying and selecting between or combining any of a plurality of first audio fidelity input signals and a plurality of second audio fidelity input signals, said method comprising selecting between any of said plurality of first input signals, actuating any of a plurality of first input signal switches to permit passage of the selected first input signal, selecting between any of said plurality of second input signals, actuating any of a plurality of second input signal switches to permit passage of the selected second input signal, optionally mixing any of said first and second input signal, actuating a dub equalization switch to permit equalization of the bands of frequencies in the selected input signal, shifting a plurality of potentiometer elements to obtain such equalization upon actuation of said dub equalization switch to equalize the bands of frequencies in any of said input signals, actuating a line equalization switch for optionally equalizing the output derived from any one or more of said input signals, and alternatively permitting passage of said input signals as an output signal without equalization by failure to activate said dub equalization switch or line equalization switch.

11. The method of claim 10 further characterized in that said audio fidelity inputs are a phonographic input, a tuner input and a recording reproducing tape input.

12. The method of claim 10 further characterized in that the method comprises manually controlling the volume of the input signals and individually manually controlling the volume of the output signal derived therefrom.

13. An audio fidelity amplification system comprising a plurality of first audio input source receiving elements for receiving first audio type input signals, a plurality of first manually operable switch means to select between any of the first input source receiving elements to select any one or more of the first audio type input signals, a plurality of second audio input source receiving elements for receiving second audio type input signals, a plurality of second manually operable switch means to select between any of the second input source receiving elements to select any one or more of the second audio input signals, one of said first input source receiving elements being a first tape input element capable of audio signals from a first tape source, one of said second input source receiving elements being a second tape input element capable of receiving audio signals from a second tape source, mixing means operatively connected to said first switch means and said second switch means and being actuated to mix a first audio type input signal and a second audio type input signal, when one of said first switch means are both actuated to permit introduction of one of the first and one of the second audio type input signals, a first manually operable dubbing switch actuable to permit a first audio type signal to be recorded on a tape of said first tape source, a second manually operable dubbing switch operatively connected to said first dubbing switch to permit a second audio type signal to be recorded on a tape of said second tape source, an active adjustable equalization means operatively connected to said first switch means and said second switch means and comprising a plurality of manually operable potentiometer controls to adjust the frequency spectrum of any first or second audio type signal or any mixed signals thereof, a tape dubbing equalizer switch operatively connected to said equalizer and said first dubbing switch and permitting any of the audio signals to be equalized before being recorded onto one of said tapes of said first or second tape sources, a line equalizer switch operatively connected to said equalizer and permitting any of the audio signals to be equalized and render the equalized signal as an output signal, said tape dubbing equalizer switch and line equalizer switch being connected so that when each is unactuated, the audio type input signal can pass through the system unequalized as an output signal, a first dubbing monitor switch operatively connected to said line equalizer switch and permitting audio reproduction of the audio type signal as recorded on the tape of the first tape source when actuated and permitting audio reproduction of the audio type signal prior to recording when unactuated, a second dubbing monitor switch operatively connected to said line equalizer switch and first dubbing monitor switch and permitting audio reproduction of the audio type signal as recorded on the tape of the second tape source when actuated and permitting audio reproduction of the audio type signal prior to recording when unactuated, and main volume control means operatively connected to said first and second dubbing monitor switches and controlling the volume of an output signal from said system.

14. The audio fidelity amplification system of claim 13 further characterized in that said first source receiving elements comprise a first phonographic input element and a tuner input element, along with said first tape input element, and the second source receiving elements comprise at least a second phonographic input and an auxiliary input, along with said second tape input element.

15. The audio fidelity amplification system of claim 14 further characterized in that internal potentiometer means are operatively connected to each of said tape input elements to equalize the incoming signal relative to the phonographic input signal.

16. The audio fidelity amplification system of claim 13 further characterized in that two of any input signals may be selected and may additionally be mixed with a microphone signal input.

17. The audio fidelity amplification system of claim 13 further characterized in that a first volume potentiometer is connected to each of the first of the pairs of input elements and a separate second volume potentiometer is connected to each of the second of the pairs of input elements.

18. The audio fidelity amplification system of claim 13 further characterized in that a balance control means is interposed between said first and second manually operable switch means.

19. The audio fidelity amplification system of claim 13 further characterized in that first ganging means operatively connects the first input switch means connected to said first phonographic input element and tuner input element so that only one of said first phonographic input means and tuner input is selected, and second ganging means operatively connects the second input switch means connected to said second phonographic input element and auxiliary input element to select between said second phonographic input and auxiliary input.

20. The audio fidelity amplification system of claim 13 further characterized in that said equalizer includes eleven distinct control elements for controlling the eleven bandwidths in each channel of any input signal or the output signal.

21. The audio fidelity amplification system of claim 13 further characterized in that a first level control means is operatively connected to receive each of the first audio type input signals and adjust the level of each of the first audio type input signals, a first variable potentiometer is connected across said first level control means to permit both gain and attenuation control, a second level control means is operatively connected to receive each of the second audio type input signals and adjust the level of each of the second audio type input signals independently of the level adjustment of the first audio type input signals, and a second variable potentiometer is connected across said second level control means to permit both gain and attenuation control.

* * * * *